United States Patent [19]

Domenick et al.

[11] Patent Number: 4,882,540
[45] Date of Patent: Nov. 21, 1989

[54] MAGNETIC RESONANCE IMAGING (MRI) APPARATUS WITH QUADRATURE RADIO FREQUENCY (RF) COILS

[75] Inventors: Robert Domenick, Palo Alto; Phillip Foreman, Santa Clara; David M. Parish, Palo Alto; Donald W. Pettibone, Cupertino, all of Calif.

[73] Assignee: Resonex, Inc., Sunnyvale, Calif.

[21] Appl. No.: 213,576

[22] Filed: Jun. 28, 1988

[51] Int. Cl.⁴ .......................................... G01R 33/20
[52] U.S. Cl. ...................................... 324/318; 128/653
[58] Field of Search ............... 324/300, 307, 309, 311, 324/318, 322; 128/653; 336/225

[56] References Cited

U.S. PATENT DOCUMENTS

| | | | |
|---|---|---|---|
| 2,820,944 | 1/1958 | Bradley | 324/300 |
| 4,467,282 | 8/1984 | Siebold | 324/309 |
| 4,484,138 | 9/1987 | Bottomley et al. | 324/307 |
| 4,695,801 | 11/1984 | Arakawa | 324/318 |
| 4,766,383 | 8/1988 | Fox et al. | 324/318 |

Primary Examiner—John Chapman
Assistant Examiner—Kevin D. O'Shea
Attorney, Agent, or Firm—Flehr, Hohbach, Test, Albritton & Herbert

[57] ABSTRACT

Quadrature coils for magnetic resonance imaging (MRI apparatus) are in the form of loops constructed of foil bands of conductive material with their respective axes forming an angle with each other to provide the quadrature phase signals. Trapezoidal cutouts are in each loop to allow for entry of the head of a human being or other large specimen. The angle between the coils is adjusted to compensate for the cutouts to provide and maintain the quadrature phase signals. Inductive coupling between the coils is minimized by three rectangular trim foils which are parallel to the main magnetic field and placed adjacent to the coils.

12 Claims, 4 Drawing Sheets

MAGNETIC RESONANCE IMAGING (MRI) APPARATUS WITH QUADRATURE RADIO FREQUENCY (RF) COILS

The present invention is directed to magnetic resonance imaging (MRI) apparatus and more specifically to the use of quadrature-type radio frequency (RF) pick up coils.

BACKGROUND OF THE INVENTION

In MRI apparatus it is known to use quadrature coils to pick up spin echo or free induction decay RF signals from a test specimen surrounded by the coils. Use of quadrature coils improves the signal to noise ratio. Since there are two coils which are in close proximity to each other, it's also necessary to minimize inductive cross coupling. The foregoing is illustrated in U.S. Pat. No. 4,695,801 issued Sept. 22, 1987, in the name of Arakawa et al.

In the Arakawa environment, the type of MRI apparatus utilized is a machine which might be manufactured by General Electric Company in which the human specimen is placed in a long tube and a cylindrical magnetic field has its main magnetic field direction coaxial with the main axis of the human body; in the present invention the field is perpendicular.

OBJECT AND SUMMARY OF THE INVENTION

It is the general object of the present invention to provide improved quadrature coils for MRI apparatus.

In accordance with the above object, there is provided magnetic resonance imaging (MRI) apparatus having a main magnetic field $B_0$, with a predetermined direction, and having a pair of radio frequency (RF) coils for picking up spin echo or free induction decay RF signals from a test specimen surrounded by the coils, which are in quadrature phase. The apparatus comprises first and second RF coils surrounding a volume to be imaged in which a test specimen would normally reside, each of the coils, including a foil band of conductive material forming a loop around an axis. The coils are positioned in the main magnetic field so that a plane defined by the intersection of the axes of the loops is perpendicular to the main magnetic field. The axes form an angle with each other to provide the necessary quadrature phase signals.

DESCRIPTION OF PREFERRED EMBODIMENTS

Figures 1, 2:
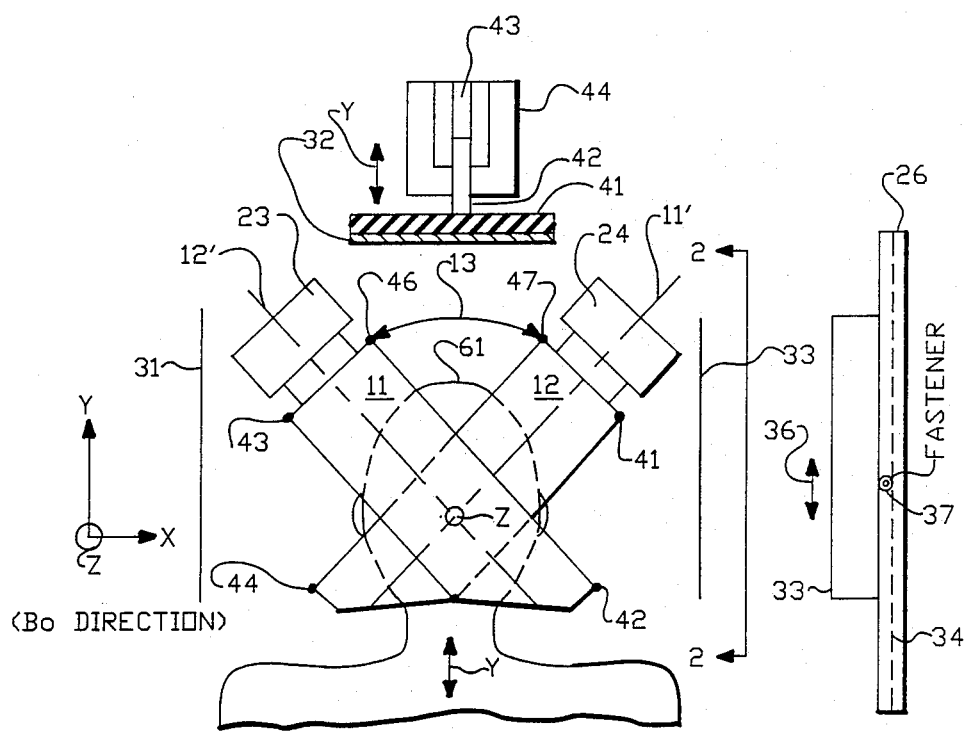
FIG. 1 is a planed view of apparatus incorporating the present invention with a human specimen.
FIG. 2 is a partial cross-sectional view taken along the line 2—2 of FIG. 1.

FIG. 1 illustrates quadrature coils 11 and 12 with coil 12 in effect being a cylinder having an axis 12' and coil 11 a cylinder having an axis 11'. Each coil is a thin band of conductive material, for example copper, and relatively wide. A single coil is described in greater detail in co-pending application Ser. No. 088,680 filed Aug. 24, 1987, and also in co-pending application Ser. No. 086,368 filed Aug. 17, 1987, and now U.S. Pat. No. 4,791,372. There a flexible wide coil is disclosed where the width of the band-like coil is such as to minimize loading consistent with a desired imaging field of view.

Figure 4:
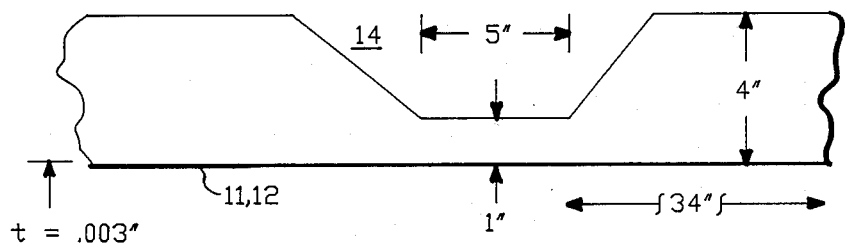
FIG. 4 is a planed view of a stretched out coil of FIG. 1.

Referring briefly to FIG. 4, the typical dimensions of a thin copper coil might be a total length of 34", a width of 4", with a thickness of 0.003" to thus provide a foil band. The latter thickness is chosen to take into account the skin effect of the radio frequencies (approximately 16 MHz), as disclosed in the above '680 application. In addition, each of the coils 11, 12 has a cutout 14 trapezoidal in shape with the band of conductive material left having a width of approximately 1" and a length of 5", as indicated. These cutouts allow for easy entry and exit of, for example, the head of a human being 16 as illustrated in FIG. 1.

Figure 3:
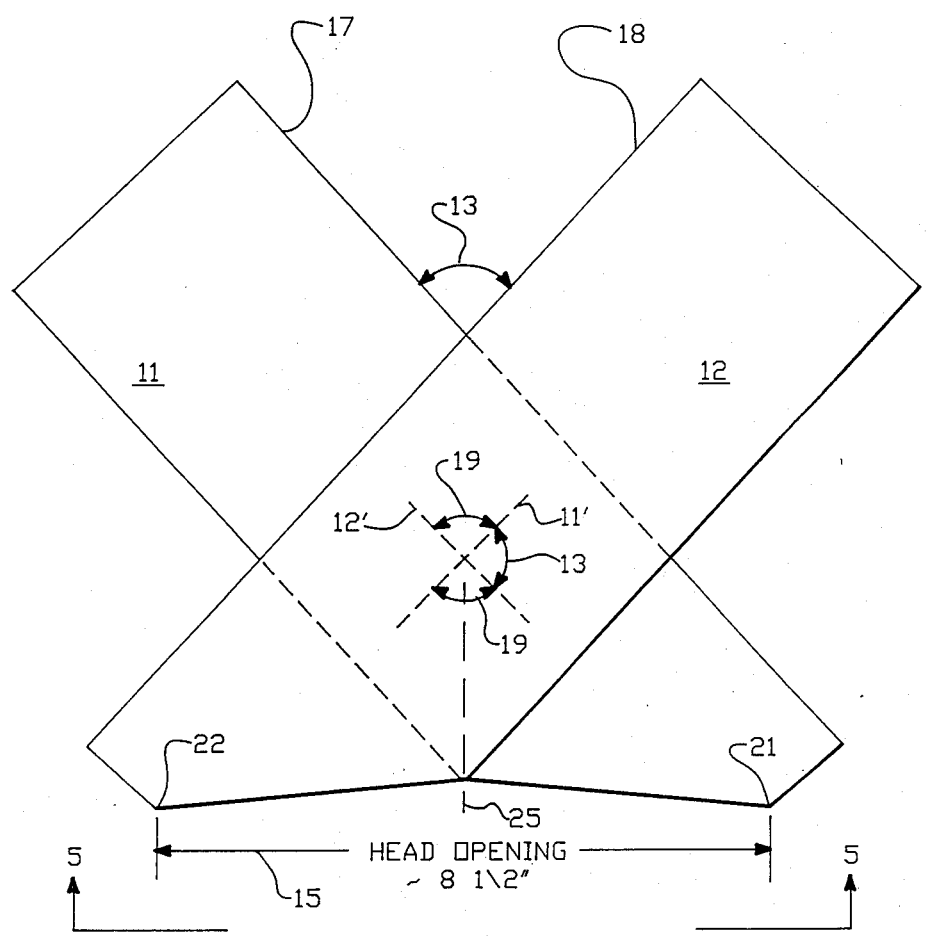
FIG. 3 is an enlarged view of the coil portion of FIG. 1.

FIG. 3 illustrates the head opening 15 in clearer detail which, with the dimensions given in FIG. 4, may be approximately 8½". This accommodates even large heads. Opening 15 has an effective axis 25 which bisects the angle 19 formed by the axes 11' and 12'. The actual angle between the axes 11' and 12' is shown with the angle 13 being indicated both at the actual intersection of the respective axes and between the edges 17 and 18 of bands 11 and 12, respectively. These are the same as can be shown by simple geometrical inspection. Angle 13 is acute and its supplement 19 is obtuse equalling 180° in total.

In any case, the angle between the axes may refer to either angle depending on the point of reference. However, specifically, because of the cutout 14 in each coil band, in order to maintain the phase quadrature signal output which is the desired function of the present quad coil apparatus, the coils 11 and 12 must be moved inwardly; that is, the cutouts must move toward each other in order to compensate for the cutouts. Thus, with the cutout of the size illustrated in FIG. 4, it has been found that the angle 13 would typically be 75°. Its supplement 19 is, of course, 105°.

Figure 5:
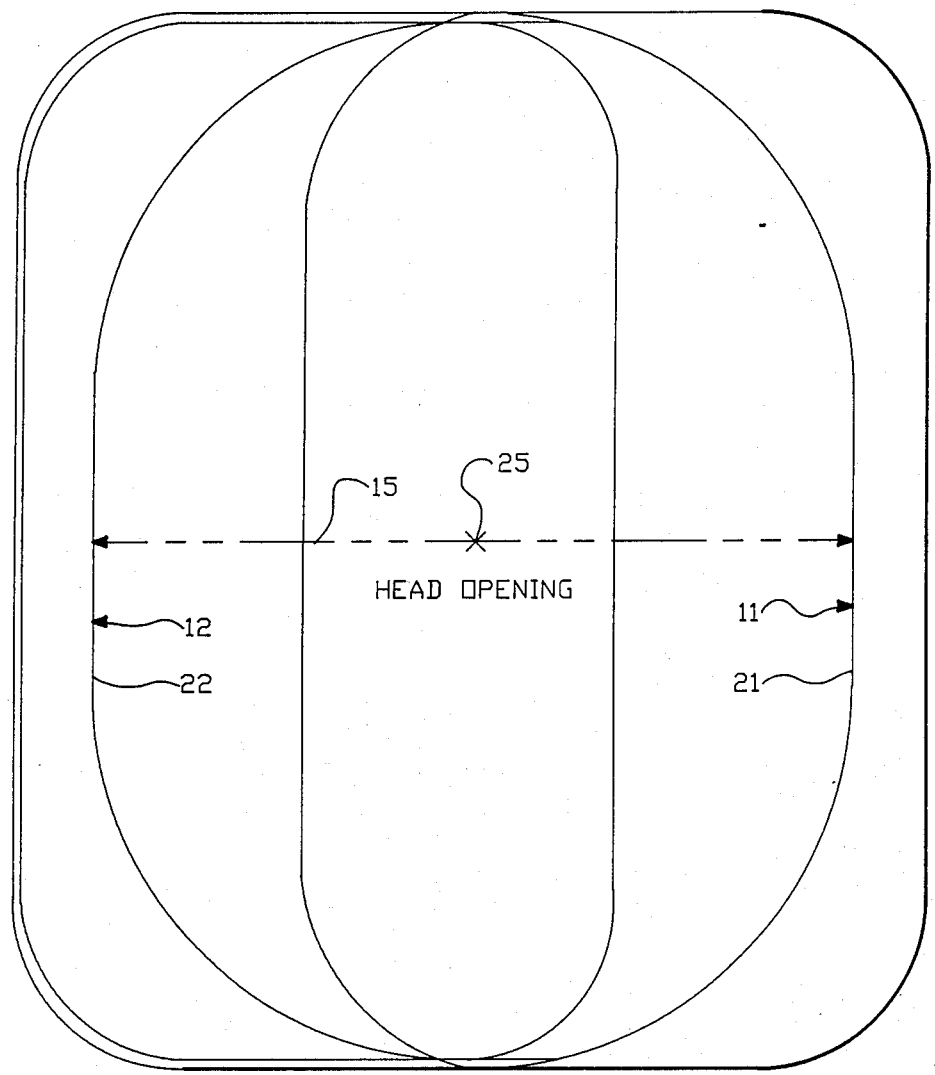
FIG. 5 is an elevation view taken substantially along the line 5—5 of FIG. 3.

FIG. 5 is an elevation view of the coils 11 and 12 with the head opening 15 between the edges 21 and 22 of coils 11 and 12, respectively. Central axis 25 of the opening is shown.

Referring back to FIG. 1, the coils 11 and 12 would normally be enclosed in, for example, a plastic form (not shown) and held by the associated supporting structure 23 and 24 which also contains tuning and matching capacitors and attaches to a base 26, as illustrated in FIG. 2. Finally, after entrance of the head 16 into the volume defined by the coils, the head may be held in position by appropriate means (not shown).

In order to minimize the inductive coupling between coils 11 and 12 (and this is necessary when tuning the coils to the desired radio frequency of, for example, 16 MHz where a very sharp tuning curve is desired), three substantially rectangular trim foils (consisting of a conductive sheet of copper, for example) 31, 32 and 33 are provided which all lie in a plane parallel to the main magnetic axis $B_0$, illustrated as the direction Z. Alternatively the foils could be tilted to be approximately parallel to the bottom or top curved portions of coils 11 and 12. FIG. 2 illustrates trim foil 33 in elevation view which is retained in base 26 in a slot 34 and is slidable in that slot in the Y direction, as indicated by the arrow 36 and retainable by an appropriate fastener 37. A typical dimension of trim foil 33 taking into account the present overall dimensions of the coils might be 3×8". The other foil 31 is similarly mounted and slidable in their respective planes. In the preferred embodiment two of the trim foils 31 and 33 are parallel to each other with coils 11 and 12 between them, with the third trim foil 32 being located perpendicular to the other trim foils. Foil 32 is mounted on a plexiglass backing plate 41 which in turn has a handle 42 mounted for sliding motion in the Y-direction (in and out from Z) in a channel 43 on a base 44. A typical dimension of foil 32 is 3.5 by 5.5 inches.

Thus, it is apparent that movement of the trim foils may be made in any direction so that the distance between the trim foils and the various edges of the coil loops may be varied. These edges are indicated by the emphasized dots as, for example, shown at 41 and 42 with respect to the trim foil 33, the edges 43 and 44 with respect to trim foil 31 and edges 46 and 47 with respect to trim foil 32.

In order to adjust the trim foils to provide for minimum inductive coupling, the following process is used. An RF signal which has a frequency substantially equal to the RF frequency of the spin echo signal to be picked up, is applied to one of the coils, for example, coil 11. Then, the induced signal is sensed in the other coil 12. The planar location of either one trim foil or a combination of the trim foils is varied to then minimize the sensed signal. Although three trim foils are shown, it is believed that one trim foil, e.g., foil 32, would perform adequately.

Figure 6:
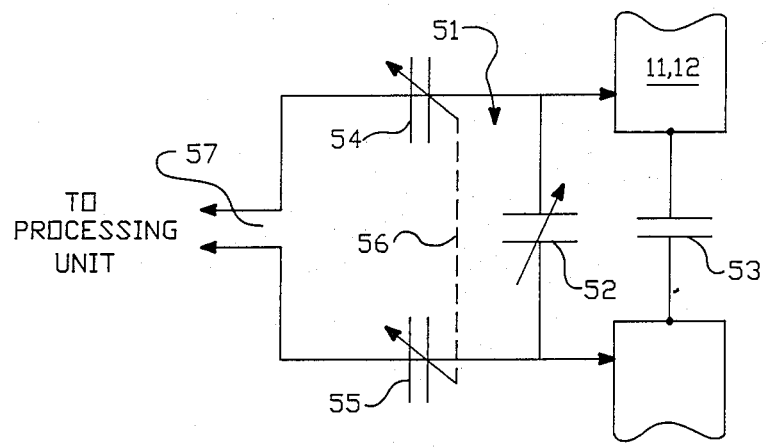
FIG. 6 is a circuit schematic showing the electrical connection to one of the coils of FIG. 1.

Referring now to FIG. 6, for the matching and tuning of both coils 11 and 12 to the standard output impedance of, for example, 50 ohms at the desired RF frequency of, for example, 16.1 to 16.2 megahertz, a set of parallel and series capacitors 51 are utilized. Specifically, there is an adjustable parallel capacitor 52 between the ends of coils 11 and 12 which reacts with the fixed capacitor 53 for tuning to the specific frequency. And then the series capacitors 54 and 55 provide for matching and are ganged or linked together at 56. The pair of outputs at 57 provide the spin echo signal which goes to a suitable processing unit. (See the above-mentioned Arakawa patent for such a unit.)

Figure 7:
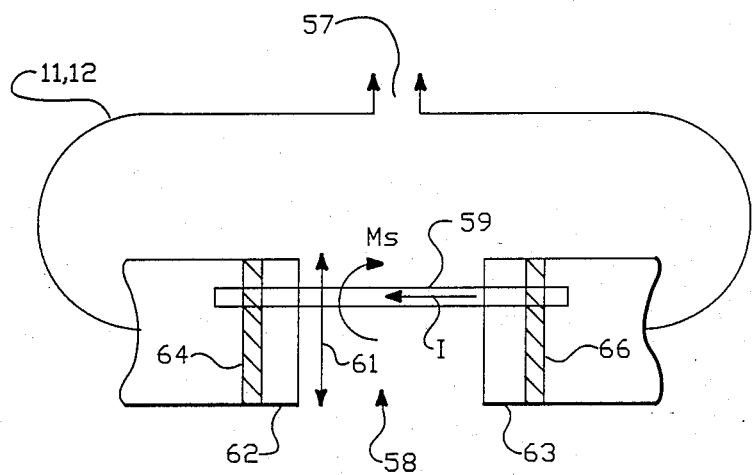
FIG. 7 is a detailed planed view of an alternate embodiment of the coils of FIG. 1.

FIG. 7 is an alternative embodiment of the coils 11 or 12 where the other side of the coil is in effect split at 58 and electrically connected by a copper shunt 59 movable in the direction of arrow 61. It lays across the ends 62 and 63 on conductive surfaces 64 and 66 to in effect modify the overall magnetic field. The width dimension, as mentioned above, for the ends of the coils 62 and 63 might be 4" with the shunt 59 having a width of ½". Provision would be made for fastening the shunt (not shown) at any desired location. In accordance with well known electrical laws, the magnetic shunt creates a field due to current, I, flowing through it in a direction shown as $M_s$ which modifies the surrounding electric field. This shunt would serve the same purpose or be complimentary to that of the trim foils 31, 32 and 33 in adjusting for minimum inductive coupling.

In conclusion, an improved quadrature coil for MRI apparatus has been provided which is uniquely suited to an MRI device where the main magnetic field is perpendicular to the body axis Y, (see FIG. 1) where ease of entry and exit is provided and where very accurate quadrature signals are produced even with the cutouts present. All adjustments including the angle between coils are fixed at the manufacturing or factory site (which is very critical with tolerances being less than ½°). Also the trim foils, while theoretically adjustable on site, are also effectively fixed at the factory where the necessary testing equipment is easily available and personnel to operate such equipment are also available as compared to a medical facility where this is not the case.

What is claimed:

1. Magnetic resonance imaging (MRI) apparatus having a main magnetic field $B_0$, with a predetermined direction, and having a pair of radio frequency (RF) coils for picking up spin echo or free induction decay RF signals from a test specimen surrounded by said coils, which are in quadrature phase comprising:

first and second said RF coils surrounding a volume to be imaged in which a said test specimen would normally reside, each of said coils, including a foil band of conductive material forming a loop around an axis, said coils having a common diameter in said direction of $B_0$ perpendicular to said axis of each coil, said coils being positioned in said main magnetic field so that a plane defined by the intersection of the axes of the loops is perpendicular to said main magnetic field, said axes forming an angle with each other to provide said quadrature phase signals.

2. Apparatus as in claim 1 where said coils include means for entry and exit of a said specimen into said volume.

3. Apparatus as in claim 2 where said entry and exit means include cutouts in each coil forming an opening with a central axis substantially bisecting said angle of said coil axes.

4. An apparatus as in claim 3 where said angle of said coil axes is adjusted to compensate for said cutouts and provide said quadrature phase signals.

5. An apparatus as in claim 4 where said angle is approximately 75°.

6. Apparatus as in claim 1 where inductive coupling occurs between said coils and including means for minimizing said coupling, including at least one trim foil consisting of a substantially rectangular thin conductive sheet lying in a plane parallel to said main magnetic field direction.

7. Apparatus as in claim 6 where said inductive coupling is minimized by the process of (1) applying a signal to one of said coils which has a frequency substantially equal to said RF frequency of the signal to be picked up; (2) sensing an induced signal from the other coil; and (3) varying the planar location of said trim foil to minimize the said sensed signal.

8. Apparatus as in claim 6 including two additional trim foils which are parallel to each other with said coils between them and said one trim foil located perpendicular to said two additional foils.

9. Apparatus as in claims 6 or 8 including means for allowing slidable movement of at least one of said trim foils within the plane of such foil for minimizing said coupling.

10. Apparatus as in claim 3 where said cutouts are trapezoidal in shape.

11. Apparatus as in claim 1 where inductive coupling occurs between said coils and including means for minimizing said coupling including movable current shunt means forming a part of each coil.

12. Apparatus as in claim 6 including means for allowing movement of said trim foil toward and away from said main magnetic field direction.

* * * * *